US012614697B2

(12) United States Patent
Zong

(10) Patent No.: US 12,614,697 B2
(45) Date of Patent: Apr. 28, 2026

(54) PECVD COATING SYSTEM AND COATING METHOD

(71) Applicant: JIANGSU FAVORED NANOTECHNOLOGY CO., LTD., Wuxi (CN)

(72) Inventor: Jian Zong, Wuxi (CN)

(73) Assignee: JIANGSU FAVORED NANOTECHNOLOGY CO., LTD., Wuxi (CN)

( * ) Notice: Subject to any disclaimer, the term of this patent is extended or adjusted under 35 U.S.C. 154(b) by 0 days.

(21) Appl. No.: 18/263,377

(22) PCT Filed: Jan. 11, 2022

(86) PCT No.: PCT/CN2022/071152
§ 371 (c)(1),
(2) Date: Jul. 28, 2023

(87) PCT Pub. No.: WO2022/161151
PCT Pub. Date: Aug. 4, 2022

(65) Prior Publication Data

US 2024/0133036 A1 Apr. 25, 2024

(30) Foreign Application Priority Data

Feb. 1, 2021 (CN) ........................ 202110139691.3

(51) Int. Cl.
*H01J 37/32* (2006.01)
*C03C 17/30* (2006.01)
(Continued)

(52) U.S. Cl.
CPC ............ *H01J 37/321* (2013.01); *C03C 17/30* (2013.01); *C23C 16/0227* (2013.01);
(Continued)

(58) Field of Classification Search
None
See application file for complete search history.

(56) References Cited

U.S. PATENT DOCUMENTS 5,824,159 A 10/1998 Takeuchi et al.
2002/0185228 A1* 12/2002 Chen ................ H01J 37/32174 156/345.48
(Continued)

FOREIGN PATENT DOCUMENTS

AU 2018204117 A1 * 6/2018 .............. B05D 1/62
CN 2472454 Y 1/2002
(Continued)

OTHER PUBLICATIONS

Choi, Y. S. et al., "Super-hydrophobic coatings with nano-size roughness prepared with simple PECVD method," *Journal of Physics* D., 46 (2013): 1-6.
(Continued)

*Primary Examiner* — Jose I Hernandez-Kenney
(74) *Attorney, Agent, or Firm* — pH IP Law

(57) ABSTRACT

Provided in the present disclosure are a PECVD coating system and coating method. In the coating method, deposition is performed on a surface of a substrate by means of a PECVD coating device so as to form an organic hydrophobic membrane, and deposition and coating involve the steps of: (A) providing an inductively coupled electric field for a reaction cavity of the PECVD coating device by means of an ICP generator of the PECVD coating device, so as to form a coupled magnetic field; and (B) providing a bias electric field for the reaction cavity by means of a bias power supply of the PECVD coating device.

19 Claims, 10 Drawing Sheets

(51) Int. Cl.

| | |
|---|---|
| ***C23C 16/02*** | (2006.01) |
| ***C23C 16/40*** | (2006.01) |
| ***C23C 16/507*** | (2006.01) |
| ***C23C 16/513*** | (2006.01) |
| *B05D 1/00* | (2006.01) |

(52) U.S. Cl.

CPC .......... *C23C 16/401* (2013.01); *C23C 16/507* (2013.01); *C23C 16/513* (2013.01); *H01J 37/3211* (2013.01); *H01J 37/32422* (2013.01); *H01J 37/32697* (2013.01); *H01J 37/32706* (2013.01); *B05D 1/62* (2013.01); *C03C 2217/76* (2013.01); *C03C 2218/153* (2013.01)

(56) References Cited

U.S. PATENT DOCUMENTS

| | | | | |
|---|---|---|---|---|
| 2008/0102222 | A1 | 5/2008 | Fujinawa et al. | |
| 2010/0279510 | A1 | 11/2010 | Nozawa et al. | |
| 2012/0160806 | A1 * | 6/2012 | Godyak | H01J 37/321 216/61 |
| 2014/0242367 | A1 * | 8/2014 | Chang | H01L 23/291 428/220 |
| 2016/0240351 | A1 | 8/2016 | Burgess et al. | |
| 2017/0256382 | A1 * | 9/2017 | Doba | H01L 21/67069 |
| 2019/0338421 | A1 * | 11/2019 | Zong | H01J 37/32082 |
| 2022/0380902 | A1 | 12/2022 | Zong | |
| 2023/0139675 | A1 * | 5/2023 | Uhm | H01J 37/321 |

FOREIGN PATENT DOCUMENTS

| | | | | |
|---|---|---|---|---|
| CN | 2907173 | Y | 5/2007 | |
| CN | 101409126 | A | 4/2009 | |
| CN | 102345101 | A | 2/2012 | |
| CN | 103668107 | A | 3/2014 | |
| CN | 105898977 | A | 8/2016 | |
| CN | 110029318 | A | 7/2019 | |
| CN | 110747447 | A | 2/2020 | |
| CN | 110965040 | A | 4/2020 | |
| CN | 211947215 | U | 11/2020 | |
| CN | 214705851 | U | 11/2021 | |
| CN | 214782134 | U | 11/2021 | |
| CN | 113897592 | A | 1/2022 | |
| CN | 113897597 | A | 1/2022 | |
| EP | 4071270 | A1 | 10/2022 | |
| EP | 4177373 | A1 | 5/2023 | |
| EP | 4177374 | A1 | 5/2023 | |
| TW | 200845191 | A | 11/2008 | |
| WO | WO-2011090397 | A1 * | 7/2011 | H01J 37/32146 |
| WO | WO-2012119700 | A1 * | 9/2012 | H01J 37/321 |

OTHER PUBLICATIONS

PCT International Search Report and Written Opinion issued in International Patent Application No. PCT/CN2022/071152, mailed Mar. 21, 2022.

Quirk, M. et al., "Semiconductor Manufacturing Technology," (2022): 452.

Wang, C. et al., "Tribological materials and surface engineering," *National Defense Industry Press,* (2012): 475-477.

Xu, L. et al., "The Effect of Plasma Electron Temperature on the Surface Properties of Super-Hydrophobic Cotton Fabrics," *Coatings,* 10 (2020): 1-10.

Extended European Search Report issued in European Patent Application No. 22745029.3, dated Dec. 3, 2024.

Peng, H., "The Study of Plasma Beam Sputtering System," A Dissertation in Fluid Mechanical & Engineering, (2008): 1-82 (machine translation).

* cited by examiner

PECVD COATING SYSTEM AND COATING METHOD

CROSS-REFERENCE TO RELATED APPLICATIONS

This application is a U.S. National Phase application under 35 U.S.C. § 371 of International Application No. PCT/CN2022/071152, filed on Jan. 11, 2022, which claims the benefit of priority to Chinese Patent Application No. 202110139691.3, filed with China National Intellectual Property Administration on Feb. 1, 2021, and entitled "PECVD COATING SYSTEM AND COATING METHOD", the entire disclosure of which is incorporated herein by reference.

TECHNICAL FIELD

The present disclosure relates to plasma device, and more particularly, to a plasma enhanced chemical vapor deposition (PECVD) coating system and a coating method.

BACKGROUND

Plasma reaction device is an important processing equipment widely applied in thin film deposition, etching, and surface treatment processes. It is divided into capacitive coupling plasma (CCP) device and inductive coupling plasma (ICP) device based on different inductive coupling elements. Currently, the capacitive coupling plasma device adopts a plate type capacitive coupling element to apply an excitation electric field with a driving frequency of 13.56 MHz to a reaction chamber to ionize a reactive gas into plasma. Due to the limitation of capacitive coupling elements, this plasma reaction device generates plasma with relatively low density of about $10^9/cm^3$. At the same time, due to the high electric potential (>20V) of capacitively coupled plasma, a surface of a substrate is easily bombarded by active ions, making it difficult to ensure the quality of material processing and surface modification.

Inductively Coupled Plasma (ICP) is a low-temperature and high-density plasma source, with radio frequency discharge through an induction coil. The coupling element of the ICP device adopts an inductively coupled coil to apply an excitation magnetic field with a drive of a radio frequency power supply to the reaction chamber to ionize a reactive gas into plasma. There is an "electrostatic coupling" effect between the plasma of ICP and the induction coil, which may easily lead to the sputtering of high-energy ions in the plasma on the coil and discharge device, damaging uniformity and stability of ICP discharge, and reducing plasma density.

SUMMARY

One advantage of the present disclosure is to provide a PECVD coating system and a coating method, wherein the PECVD coating system excites and generates plasma through combination of inductive coupling and a bias electric field, to improve the density of the plasma.

One advantage of the present disclosure is to provide a PECVD coating system and a coating method, wherein the PECVD coating system is adapted for forming an organic hydrophobic coating by means of plasma enhanced chemical vapor deposition.

An advantage of the present disclosure is to provide a PECVD coating system and a coating method, wherein during the operation of the PECVD coating system, an inductively coupled electric field promotes excitation to generate plasma, a bias electric field ionizes a gas through a glow discharge effect, and has a directional traction acceleration effect on positive ions.

An advantage of the present disclosure is to provide a PECVD coating system and a coating method, wherein the inductive coupling and bias electric field are simultaneously used to increase the energy of the plasma reaching a surface of a substrate on the basis of obtaining highly ionized plasma, in order to facilitate obtaining of the organic hydrophobic coating which is dense.

One advantage of the present disclosure is to provide a PECVD coating system and a coating method, wherein the PECVD coating system operates at a relatively low process temperature, which makes the coating has a greatly expanded application range and may be used for many polymer materials, such as PC, PMMA, and ABS.

One advantage of the present disclosure is to provide a PECVD coating system and a coating method, wherein the organic hydrophobic coating prepared by the PECVD coating system has a high transparency, and the substrate will not have a transmittance which is excessively impacted by the organic hydrophobic coating formed thereon.

One aspect of the present disclosure provides a coating method, which deposits to form an organic hydrophobic coating on a surface of a substrate through a PECVD coating equipment, and includes:

(A) providing an inductively coupled electric field to a reaction chamber of the PECVD coating equipment through an ICP generator of the PECVD coating equipment, so as to form a coupled magnetic field; and (B) providing a bias electric field to the reaction chamber through a bias power supply of the PECVD coating equipment.

The coating method according to an embodiment, wherein in step (A), a gas in the reaction chamber is extracted from an extraction opening of the reaction chamber, and the extraction opening and the ICP generator are located in two roughly perpendicular directions.

The coating method according to an embodiment, wherein in step (A), a reactive gas is fed into the reaction chamber through an air inlet of the reaction chamber, and the air inlet is located in a direction where it is consistent or roughly parallel with the ICP generator.

The coating method according to an embodiment, wherein in step (A), the ICP generator is provided on the outer side of the reaction chamber, and during operation, the inductively coupled electric field provided by the ICP generator passes through a discharge port of the reaction chamber from outside to inside, to enter a reaction cavity of the reaction chamber.

The coating method according to an embodiment, wherein in step (A), the inductively coupled electric field is generated through an induction coil of the ICP generator, and the induction coil is a planar spiral coil.

The coating method according to an embodiment, wherein in step (A), the induction coil and the reaction cavity are isolated at the discharge port by an isolation plate of the ICP generator.

The coating method according to an embodiment, wherein in step (A), a matching work power supply is provided for the induction coil by means of a radio frequency power supply and a matcher.

The coating method according to an embodiment, wherein in step (A), the ICP generator is located on the inner side of the reaction chamber, and during operation, the electric field generated by the ICP generator passes through a discharge port of the reaction chamber from inside to outside, to enter a reaction cavity of the reaction chamber.

The coating method according to an embodiment, wherein in step (A), an inductively coupled electric field is provided to the reaction cavity by at least two discharge assemblies symmetrically arranged in the back direction.

The coating method according to an embodiment, wherein in step (A), the discharge port is provided ringwise on an inner wall of the reaction chamber.

The coating method according to an embodiment, wherein in step (A), the inductively coupled electric field is generated through a set of symmetrically distributed induction coils of the ICP generator, and the induction coils are planar spiral coils.

The coating method according to an embodiment, wherein in step (A), the induction coils and the reaction cavity are isolated at the discharge port by means of an annular isolation plate of the ICP generator.

The coating method according to an embodiment, wherein in step (A), a matcher is used to adjust a radio frequency power supply to provide a matching work power supply for the induction coils.

The coating method according to an embodiment, wherein in step (B), a positive electrode of the bias power supply is electrically connected to the reaction chamber, a negative electrode of the bias power supply is electrically connected to a carrier in the reaction chamber, and the reaction chamber is grounded.

The coating method according to an embodiment, wherein in step (B), during operation, electrical connection to the bias power supply is maintained by means of an electrode connector of the carrier.

The coating method according to an embodiment, wherein in step (B), during operation, a spring of a mounting fixed seat presses against a bottom plate of the carrier, to maintain contact between the electrode connector and the bias power supply.

The coating method according to an embodiment, wherein during operation, the ICP generator and the bias power supply are controlled to operate simultaneously.

The coating method according to an embodiment, wherein the organic hydrophobic coating contains Si and O, or Si, O and H.

The coating method according to an embodiment, wherein the organic hydrophobic coating is formed from a chain siloxane compound or a cyclic siloxane compound.

The coating method according to an embodiment, wherein in step (A), a lifting frame is used to control opening or closing of a cover of the reaction chamber.

DETAILED DESCRIPTION

The following description serves to disclose the present disclosure, in order to enable one skilled in the art to realize the present disclosure. Preferred embodiments in the following description are given by way of example only, and other obvious variations will occur to those skilled in the art. The basic principles of the present disclosure defined in the following description may be applied to other embodiments, variations, modifications, equivalents, and other technical solutions without departing from the spirit and scope of the present disclosure.

It should be appreciated by those skilled in the art that, in the context of the present disclosure, the orientation or positional relationships indicated by the terms “longitudinal”, “transverse”, “upper”, “lower”, “front”, “back”, “left”, “right”, “vertical”, “horizontal”, “top”, “bottom”, “inner”, “outer”, etc. are based on those illustrated in the figures. In addition, these terms are merely for convenience in describing the present disclosure and to simplify the description, rather than to indicate or imply that the apparatus or element referred to must have a particular orientation or be constructed and operated in a particular orientation, and thus the above terms should not be construed as limiting the present disclosure.

It should be understood that, the term “a” or “an” should be interpreted as “at least one” or “one or more”, that is, in one embodiment, the number of an element may be one, and in another embodiment, the number of the element may be plural, and the term “a” or “an” should not be construed as a limitation on the number.

References to “one embodiment”, “an embodiment”, “embodiment”, “exemplary embodiment”, “various embodiments”, “some embodiments”, etc. indicate that, such embodiments describing the present disclosure may include a specific feature, structure, or characteristic, but not every embodiment must include that feature, structure, or characteristic. In addition, some embodiments may have some, all, or none of the features described for other embodiments.

Figure 1:
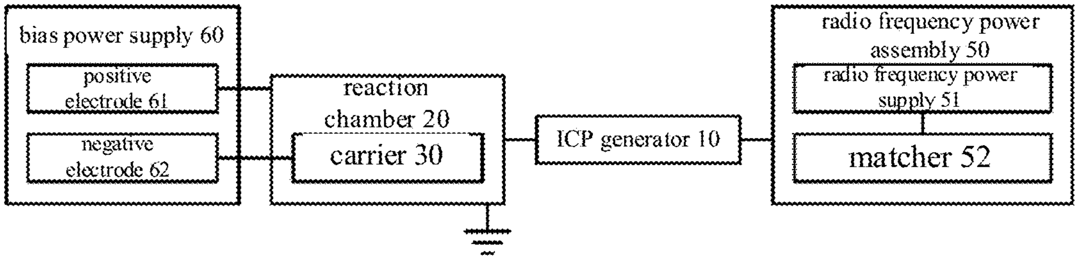
FIG. 1 is a schematic block diagram of a PECVD coating system according to a first preferred embodiment of the present disclosure.
Figure 2A:
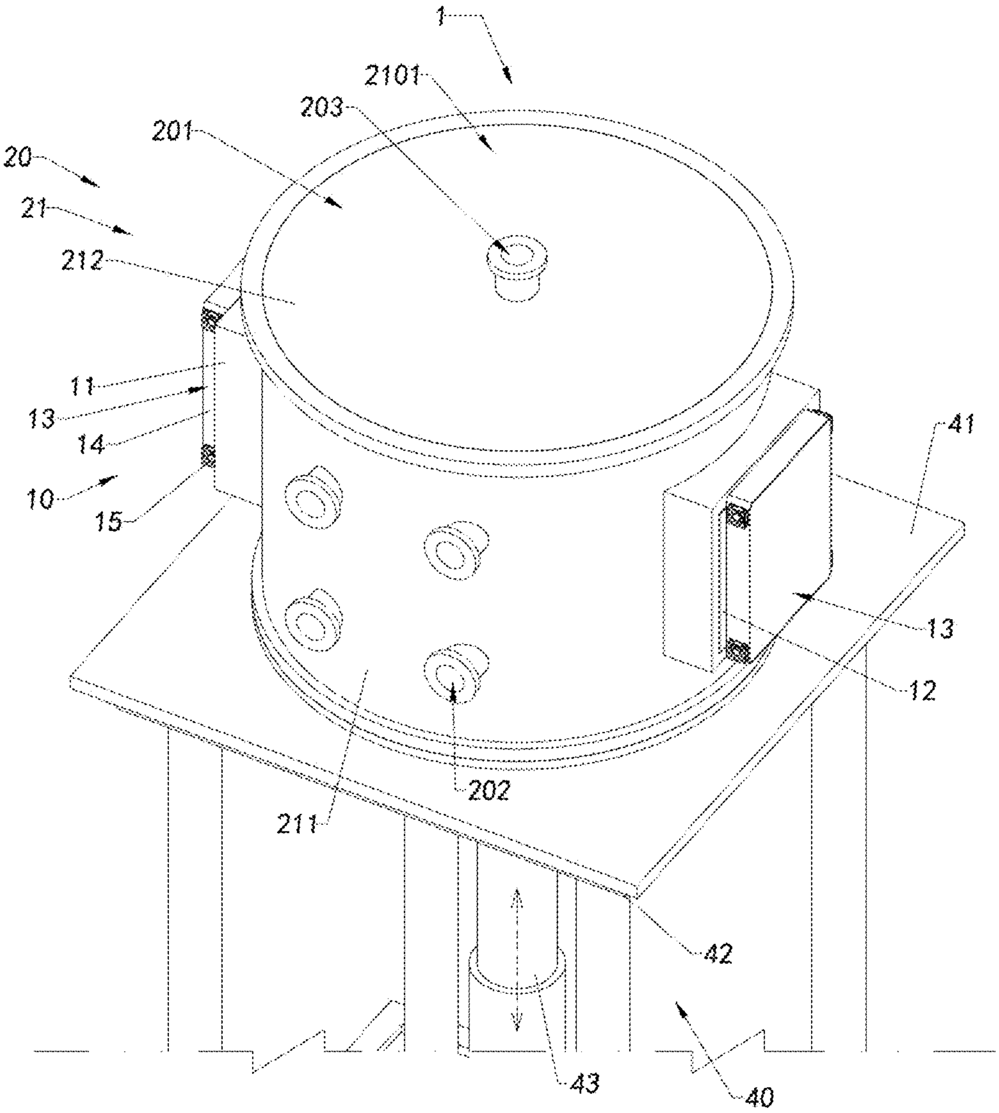
FIG. 2A is a schematic graphic model of a PECVD coating system according to a first embodiment of the present disclosure.
Figure 2B:
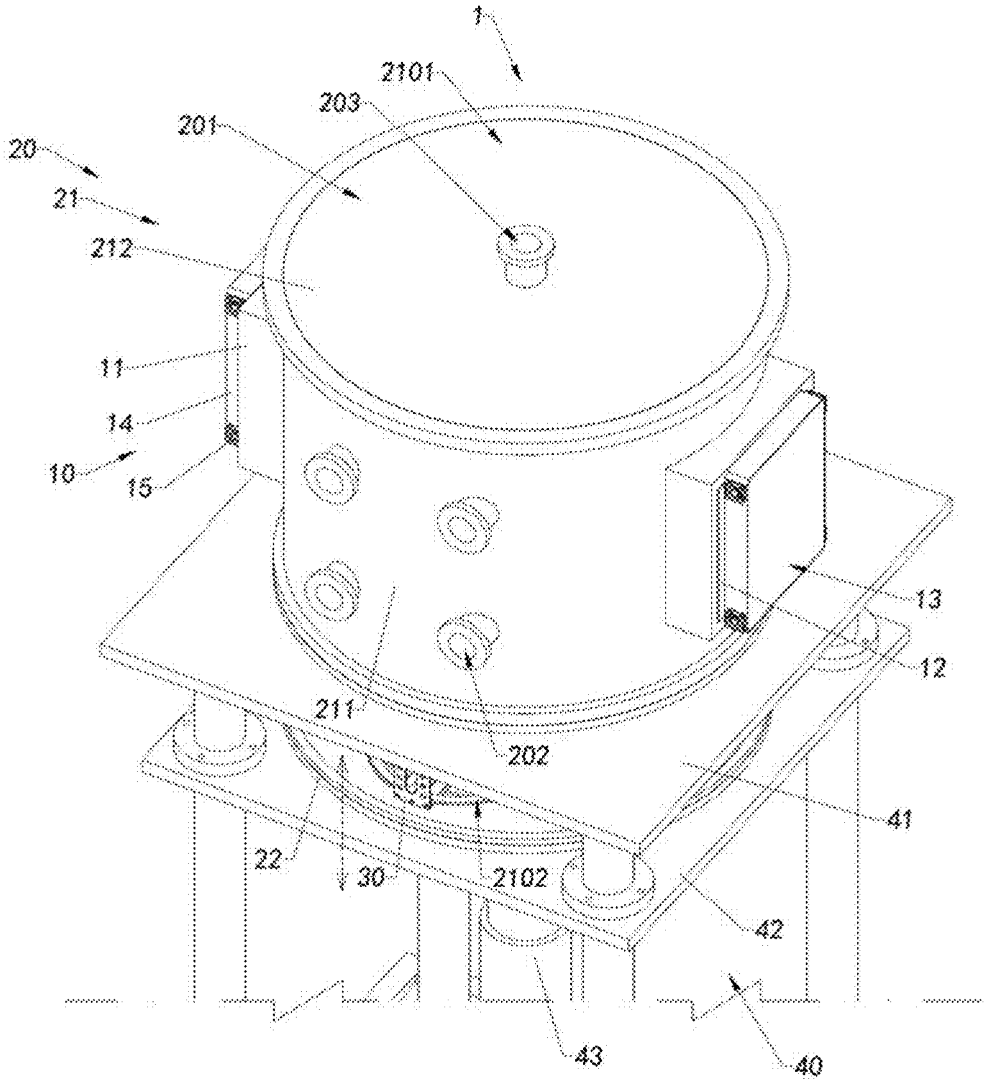
FIG. 2B is another schematic graphic model of the PECVD coating system according to the first embodiment of the present disclosure.
Figure 3:
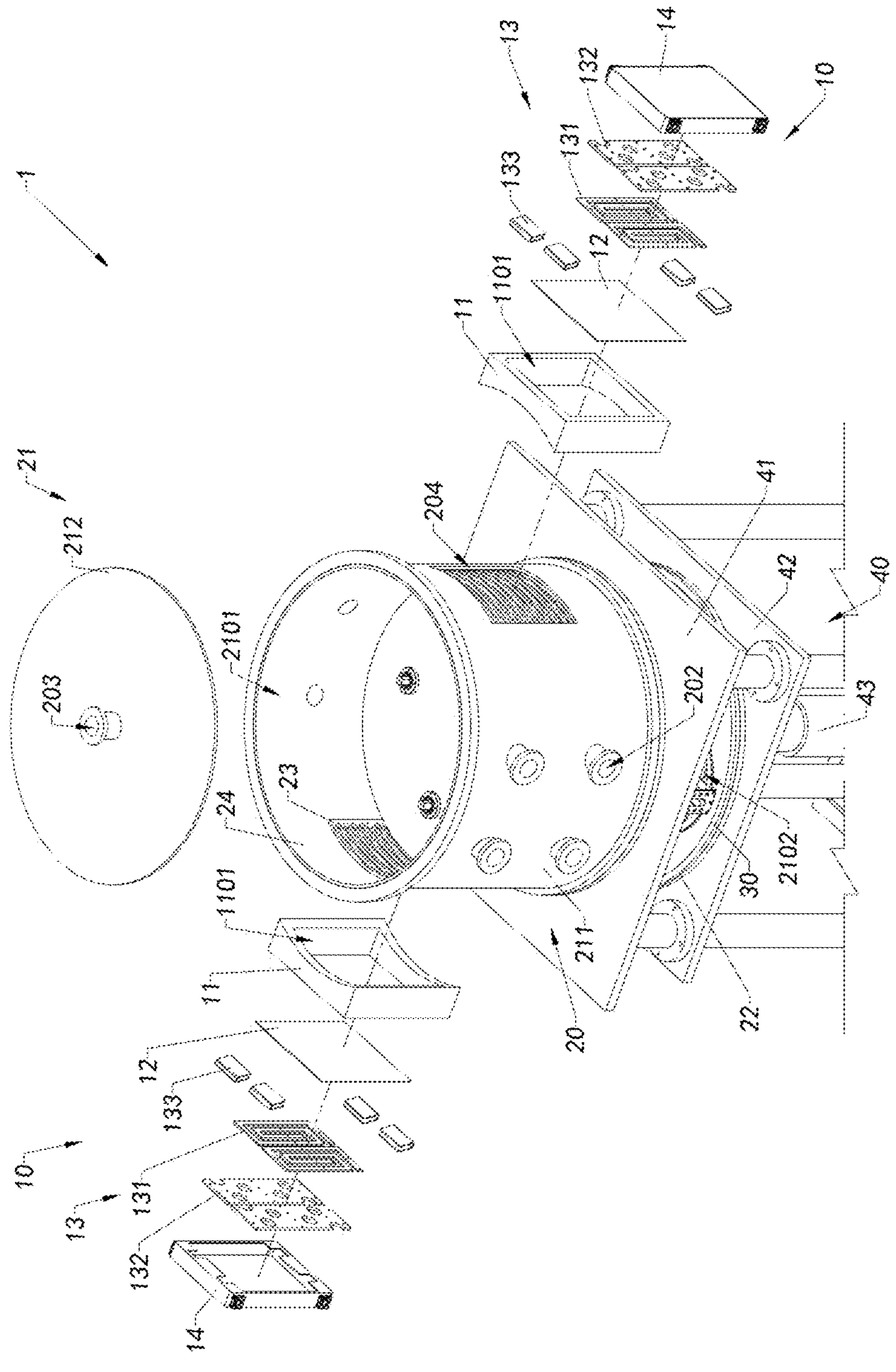
FIG. 3 is a schematic exploded view of the PECVD coating system according to the first embodiment of the present disclosure.

Referring to FIGS. 1 to 3, which illustrate a PECVD coating system 1 according to a first embodiment of the present disclosure. The PECVD coating system 1 is used for coating a substrate through a PECVD process.

The PECVD coating system 1 deposits a vapor phase of organic gas reactive raw materials onto a surface of a substrate through the PECVD process to form an organic hydrophobic coating. Exemplarily but not restrictively, the organic hydrophobic coating may contain Si and O, or Si, O, and H. The PECVD coating system 1 utilizes the chemical deposition reaction process of plasma to make the thickness of the organic hydrophobic coating relatively small, such as at nanoscale. Moreover, the organic hydrophobic coating with target performance may be obtained by controlling a process parameter during the PECVD deposition process. For example, the organic hydrophobic coating with a predetermined thickness, transparency, or hydrophobic angle may be obtained by the controlling.

Furthermore, the PECVD coating system 1 is used to form an organic super-hydrophobic coating on the surface of the substrate through the PECVD process. The organic super-hydrophobic coating may have a water contact angle of more than 150°, such as more than 156°, and a sliding angle of less than 10°, such as less than 5°, or less than 3°.

As compared to other existing deposition processes, the vapor PECVD process has many advantages, which include: (1) it is a dry process that generates thin coatings uniformly without pinholes; (2) the solvent resistance, chemical corrosion resistance, heat resistance, and wear resistance and other chemical and physical properties of a plasma polymerized coating are stable; (3) the plasma polymerized coating has good adhesion to a substrate; (4) a uniform coating may be prepared even on an extremely uneven surface of a substrate; (5) the coating is prepared at a low temperature, and may be prepared at room temperature to effectively avoid damage to temperature sensitive devices; and (6) the plasma process may prepare coatings with a thickness of not only micrometers, but also ultra-thin nanoscale.

The substrate may be made of epoxy laminated materials, synthetic resin materials, epoxy resin bonded glass fiber cloth, composite epoxy materials, polytetrafluoroethylene or other polymer materials, phenolic cotton paper, silicon, glass, ceramics, paper, etc. The substrate may also be a keyboard, a computer, a mobile phone, an earphone, a PSP, a car windshield, a camera, or a password lock panel. The substrate may also be one or more selected from a group consisting of assembled plastic products, printed circuit boards, electronic products, electronic assembly semi-finished products, and electrical components. When the substrate is an electronic device with a plastic surface, it is exemplarily, but not limited to, mobile phones, tablet personal computers, keyboards, electronic readers, wearable devices, displays, earphones, PSPs and other devices. When the substrate is an electrical component, the electrical component may be a resistor, capacitor, transistor, diode, amplifier, relay, transformer, battery, fuse, integrated circuit, switch, LED, LED display, piezoelectric element, optoelectronic component, or antenna, or oscillator, etc. It should be understood by those skilled in the art that, this is only an example and does not limit type of the substrate.

According to an embodiment of the present disclosure, the organic hydrophobic coating formed on the surface of the substrate by the PECVD coating system 1 has certain resistance to ultraviolet oxidation, and further high temperature and humidity resistance, as well as acid resistance. For products with the organic hydrophobic coating, the color of the substrate itself may be observed through the organic hydrophobic coating within a certain thickness range.

The PECVD coating system 1 includes an ICP generator 10, a reaction chamber 20, a carrier 30, a radio frequency power assembly 50, and a bias power supply 60.

The reaction chamber 20 has a reaction cavity 201. The carrier 30 is used to place the substrate, and is adapted for being accommodated within the reaction cavity 201, so as to facilitate coating of the substrate within the reaction cavity 201, i.e., the PECVD process is carried out within the reaction cavity 201 to form the organic hydrophobic coating.

According to an embodiment of the present disclosure, the ICP generator 10 is provided on the outer side of the reaction chamber 20. Furthermore, the ICP generator 10 is detachably fixed to the outside of the reaction chamber 20. According to other embodiments of the present disclosure, the ICP generator 10 and the reaction chamber may also have other positional relationships.

In this embodiment and the accompanying drawings of the present disclosure, it is exemplarily illustrated that, the PECVD coating system 1 includes two ICP generators 10 that are symmetrically distributed outside the reaction chamber. According to other embodiments of the present disclosure, the PECVD coating system 1 may also include more ICP generators 10 symmetrically distributed outside the reaction chamber. The induced magnetic field formed by the symmetrically distributed ICP generator 10 has good uniformity in distribution and high efficiency, improving plasma density and uniformity. The distribution manner of the ICP generators 10 is not limited to the above embodiments and distribution manners. And, the ICP generators 10 may also have other quantities and distribution manners, such as arrangement of single one or consecutive arrangement of three.

Furthermore, the circuit connection relationship of the PECVD coating system 1 includes that, the radio frequency power assembly 50 is electrically connected to the ICP generator 10 to form a radio frequency electric field operating circuit. The bias power supply 60 is electrically connected to the reaction chamber and the carrier 30 to form a bias electric field circuit.

According to some embodiments, the ICP generator 10 excites to generate a coupled magnetic field by means of inductive coupling.

The bias power supply 60 has a positive electrode 61 and a negative electrode 62. The positive electrode 61 is electrically connected to the reaction chamber 20. The negative electrode 62 is electrically connected to the carrier 30. The reaction chamber 20 is grounded. That is, a bias electric field operating circuit is formed between the reaction chamber 20 and the carrier 30, and a bias electric field is formed within the reaction cavity 201 during operation.

The reaction chamber 20 includes a body 21 and a cover 22. The body 21 forms the reaction cavity 201. The cover 22 is separably connected to the body 21 to open or close the reaction cavity 201. That is to say, by controlling the cover 22, the opening or closing of the reaction cavity 201 may be controlled. According to an embodiment of the present disclosure, the reaction chamber 20 is arranged in a vertical direction, and the cover 22 is located below the body 21 to facilitate carrying the substrate to be coated on the carrier 30 inside the cover 22. That is, the cover 22 is a bottom cover. Certainly, according to other embodiments of the present disclosure, the reaction chamber 20 may also be placed in other ways. That is to say, the substrate is loaded upward from below the reaction chamber 20. According to other embodiments of the present disclosure, other loading manners may also be employed, such as loading the substrate from the front of the reaction chamber 20.

Furthermore, according to an embodiment of the present disclosure, the body 21 includes a surrounding wall 211 and a top cover 212. The surrounding wall 211 forms a first opening 2101 and a second opening 2102. The top cover 212 is provided at the first opening 2101. The bottom cover is provided at the second opening 2102. That is to say, when the top cover 212 and the bottom cover are installed on the surrounding wall 211, the top cover 212 closes the first opening 2101, and the bottom cover closes the second opening 2102.

It is remarkable that in the accompanying drawings of this embodiment of the present disclosure, the reaction chamber 20 in a cylindrical shape is exemplarily illustrated. According to other embodiments of the present disclosure, the reaction chamber 20 may also in other shapes, such as polygonal cylinders. The present disclosure is not limited hereto.

According to an embodiment of the present disclosure, the top cover 212 may be hermetically fixed to the first opening 2101 of the surrounding wall 211 through a screw and a sealing pad.

The reaction chamber 20 has at least one air inlet 202 and one extraction opening 203. The air inlet 202 is used to transport a reactive gas into the reaction cavity 201. The extraction opening 203 is used to connect with an air extractor to extract the gas from the reaction cavity 201, in order to exhaust a waste gas from the reaction chamber 20, and to control pressure inside the reaction chamber 20.

According to an embodiment of the present disclosure, the air inlet 202 is provided on the surrounding wall 211 of the body 21, and the extraction opening 203 is provided on the top cover 212 of the body 21. According to other embodiments of the present disclosure, the air inlet 202 and the extraction opening 203 may be provided at other positions. Exemplarily but not restrictively, both the air inlet 202 and the extraction opening 203 are provided on the top cover 212 or on the surrounding wall 211. The present disclosure is not limited hereto. According to other embodiments of the present disclosure, the air inlet 202 may also be provided to the ICP generator 10. The air inlet 202 may be communicated with an evaporator, so as to feed the raw materials that are evaporated and gasified by the evaporator into the reaction chamber 20. The extraction opening 203 may be connected to an air extraction system, which is exemplarily, but not limited to, a vacuum pump system.

According to an embodiment of the present disclosure, the gas in the reaction chamber 20 is extracted from the extraction opening 203 of the reaction chamber 20, and the extraction opening 203 and the ICP generator 10 are located in two roughly perpendicular directions. The reactive gas is fed into the reaction chamber 20 by the air inlet 202 of the reaction chamber 20. The air inlet 202 is located in a direction where it is consistent or roughly parallel with the ICP generator 10. It is remarkable that, the position arrangement of the ICP generator and the air inlet influences the air inflow position and the position and direction of the generated coupled electric and magnetic fields. In this embodiment of the present disclosure, the arrangement manner enables the incoming reactive gas to approach the coupled electric field and magnetic field, and thus enabling to better ionize the reactive gas.

The surrounding wall 211 of the reaction chamber 20 has a discharge port 204. The ICP generator 10 is installed at the discharge port 204 to facilitate the radio frequency electric field generated by the ICP generator 10 to pass through the discharge port 204 to enter the reaction cavity 201.

According to an embodiment of the present disclosure, the reaction chamber 20 includes a grid 23, which is provided at the discharge port 204 to space and connect the inner and outer sides of the surrounding wall 211. According to an embodiment of the present disclosure, the grid 23 is fixed on the inner side of the surrounding wall 211, and located on the inner side of the discharge port 204.

In this embodiment of the present disclosure, the ICP generator 10 is provided on the outer side of the reaction chamber 20. During operation, the electric field generated by the ICP generator 10 passes through the discharge port 204 of the reaction chamber 20 from outside to inside, to enter the reaction cavity 201 of the reaction chamber 20.

According to an embodiment of the present disclosure, the PECVD coating system includes a lifting frame 40. The cover 22 is installed on the lifting frame 40, to facilitate controlling the opening and closing of the cover 22 through the lifting frame 40. The lifting frame 40 includes a first platform 41, a second platform 42, and a driving mechanism 43. The body 21 is provided on the first platform 41. The cover 22 is provided on the second platform 42. The driving mechanism 43 guides the second platform 42 to move up and down. Thereby, controlling the opening or closing of the reaction chamber 20.

According to an embodiment, the PECVD coating system includes a driving element, which is connected to the carrier 30, to drive the carrier 30 to coat in the reaction chamber. For example, the driving element drives the carrier 30 to rotate, that is, the carrier 30 carries the substrate and moves for dynamic coating. Exemplarily but not restrictively, the driving element may be a motor or a transmission gear.

The carrier 30 is used for fixing or placing the substrate to be coated. According to an embodiment of the present disclosure, the lower end of the carrier 30 is connected to a motor which controls the rotation of the carrier 30. The bottom of the carrier 30 is provided with an electrode connector. During coating operation, the electrode connector may be maintained in continuous contact with the carrier 30 of the reaction chamber, thereby enabling to maintain continuous electrical connection between the negative electrode 62 of the bias power supply 60 and the carrier 30 through the electrode connector. According to some embodiments, the electrode connector is located at the center of rotation of the carrier 30, so that rotation does not affect stability of the electrical connection. The electrode connector presses against a lower end of the bottom plate of the carrier 30 through a spring on a mounting fixed seat, so that during the rotation process of the carrier 30, the electrode connector may be maintained in contact with the carrier 30 at all times.

The ICP generator 10 includes a mounting frame 11, an isolation plate 12, and a discharge assembly 13. The isolation plate 12 is installed to the mounting frame 11. The mounting frame 11 is installed to the reaction chamber 20. The mounting frame 11 is provided to enclose the discharge port 204 of the reaction chamber 20. The mounting frame 11 has a window 1101. The isolation plate 12 is installed on the window 1101, with the surrounding side being sealed. The discharge assembly 13 is provided on the outer side of the isolation plate 12. That is to say, the isolation plate 12 is isolated on the inner sides of the discharge assembly 13 and the window 1101 of the mounting frame 11, and the electric field of the discharge assembly 13 may pass through the isolation plate 12 to enter the reaction cavity 201 through the discharge port 204. In other words, the isolation plate 12 isolates the gas inside the mounting frame 11 from flowing outward but allows the electric field to pass through, in order to generate an induced magnetic field in the reaction cavity 201.

The discharge assembly 13 includes an induction coil 131, a fixing plate 132, and a fixing element 133. The induction coil 131 and the fixing plate 132 are stacked and fixed through the fixing element 133.

The induction coil 131 is located on the outer side of the isolation plate 12. The isolation plate 12 is composed of an insulating material. According to some embodiments, the isolation plate 12 is a quartz or ceramic shrouding, thereby reducing the influence on feeding of the induced electric field of the induction coil 131 into the reaction chamber 20.

The radio frequency power assembly 50 includes a radio frequency power supply 51 and a matcher 52. The ICP generator 10 may be electrically connected to the radio frequency power supply 51 and the radio frequency matcher 52. And, the matcher 52 adjusts the radio frequency power supply 51 to match with the ICP generator 10.

One end of the induction coil 131 is electrically connected to the output end of the matcher 52. And, the other end of the induction coil 131 is electrically connected to the ground end of the matcher 52. In addition, the matcher 52 is electrically connected to the radio frequency power supply 51. Thereby, an operating circuit is constituted. The operating circuit constituted of the induction coil 131, the radio frequency power supply 51, and the matcher 52 provides the reaction chamber 20 with an electromagnetic field that excites the plasma.

During operation process, through adjusting by the matcher 52, the power of the radio frequency power supply 51 may be transmitted to two ends of the induction coil 131 to the maximum extent. A certain amount of radio frequency current will be generated at the two ends of the induction coil 131. In addition, predetermined amplitudes of voltages will be generated simultaneously at the two ends of the induction coil 131. The radio frequency current flowing through the surrounding induction coil 131 excites in space to generate a radio frequency magnetic field, which may pass through the isolation plate 12 to enter the reaction chamber 20, thereby generating a magnetic flux inside the reaction chamber 20. According to Faraday law of electromagnetic induction, the radio frequency magnetic flux generated will in turn induce and generate a radio frequency electric field, which will accelerate the movement of electrons in the plasma, making them constantly collide with and ionize neutral gas molecules, thereby coupling the radio frequency energy in the induction coil 131 to the ionized gas and maintaining the plasma discharge.

According to an embodiment of the present disclosure, the induction coil 131 is a planar spiral coil. The discharge assembly 13 includes a set of induction coils 131, which are electrically connected in series. The two ends of the set of induction coils 131 are respectively electrically connected to the matcher 52, in which one end of one of the induction coils 131 is connected to the output end of the matcher 52, and one end of another one of the induction coils 131 is connected to the ground end of the matcher 52. It is remarkable that, a single-layer planar surrounding induction coil 131 is simple in structure design, small in inductance and volume of discharge space, and may improve discharge performance of ICP.

It is remarkable that, according to an embodiment of the present disclosure, the induction coil 131 is in a planar spiral structure. And, two induction coils 131 form the set of induction coils 131, and are arranged to reduce the "electrostatic coupling" effect between the coils and the plasma, effectively suppressing bombardment of positive ions on the surface materials of the coils, and obtaining a stable and uniform high-density plasma source, to promote the widespread application of ICP plasma technology in the field of thin coating deposition.

The ICP generator 10 further includes a housing 14, which is provided on the outer side of the discharge assembly 13 to cover the discharge assembly 13. The ICP generator 10 further includes a heat dissipation element 15, which is provided to the housing 14 to dissipate the heat generated by the discharge assembly 13. The heat dissipation element 15 is exemplarily, but not limited to, a fan.

According to an embodiment of the present disclosure, the radio frequency power assembly 50 serves as the power supply for the ICP generator 10, and generates an alternating magnetic field through the inductive coupling effect of the coil(s), thereby achieving gas ionization. A rapidly changing magnetic field is conducive to sufficient and uniform ionization. The bias power supply 60 may be a pulse-bias power supply, which ionizes gases through a glow discharge effect, while having a directional traction acceleration effect on positive ions. In the process of forming the organic hydrophobic coating, there is a bombardment effect, which may cause a dense organic hydrophobic coating with high hardness.

According to an embodiment of the present disclosure, the ICP generator 10, the radio frequency power assembly 50, and the bias power supply 60 may be used simultaneously to increase the energy of the plasma reaching the surface of the substrate on the basis of obtaining highly ionized plasma, which is conducive to obtaining a dense organic hydrophobic coating. The simultaneous use of the ICP generator 10 and the radio frequency power assembly 50 as well as the bias power supply 60 may improve deposition efficiency. As a result, the organic hydrophobic coating may be effectively deposited and formed on the surface of the substrate, and the required preparation time is shortened. This is very advantageous to industrial production of the organic hydrophobic coating, due to that the production efficiency may be improved. It is also remarkable that, the pulse-bias power supply 60 applies a bias voltage to the carrier 30, which may independently regulate the ion energy incident on the surface of the substrate.

Furthermore, the present disclosure provides a method for preparing the organic hydrophobic coating by the PECVD coating system 1, which is as follows.

(1) Substrate Cleaning

The substrate is placed in a cleaning agent for cleaning, so as to remove greasy dirt from the surface thereof.

(2) Substrate Activation

The cleaned and dried substrate is placed into the reaction chamber 20 of the PECVD coating system 11. And, the reaction chamber 20 is then evacuated. Thereafter, an inert gas is introduced into the reaction cavity 201 through one of the air inlets 202. And then, the ICP generator 10 and the bias power supply 60 are controlled to discharge in the reaction cavity 201 under a certain vacuum degree and at a certain voltage, for ion bombardment activation.

(3) Formation of the Organic Hydrophobic Coating

A siloxane monomer and an inert gas are introduced into the reaction cavity 201 of the reaction chamber 20. And then, the vacuum degree and the voltage are controlled to form a transparent wear-resistant coating, that is, form the organic hydrophobic coating, on the surface of the substrate under a certain vacuum degree and at a certain voltage.

According to an embodiment of the present disclosure, in the step of substrate cleaning, the cleaning agent may be an organic solvent, such as ethanol or isopropanol. The cleaning agent may also be deionized water. The greasy dirt on the surface of the substrate may be removed with the assistance of ultrasound.

It should be understood that, if there is a risk of ultrasonic damage to the substrate, an organic solvent may be used for cleaning first, and then, plasma may be used for cleaning and activation in the step of substrate activation. By the step of substrate activation, impurities and oxide layers on the surface of the substrate may be further removed, to facilitate the bonding strength between the organic hydrophobic coating formed in a subsequent process and the substrate.

According to an embodiment of the present disclosure, in the step of substrate cleaning, the substrate is respectively placed in deionized water and industrial high-purity ethanol or isopropanol for ultrasonic cleaning, for 10 to 20 minutes, to remove impurities on the surface of the substrate.

According to an embodiment of the present disclosure, in the step of substrate activation, the inert gas is one or more selected from a group consisting of He, Ar, and Kr.

According to an embodiment of the present disclosure, in the step of substrate activation, after the inert gas is introduced, the vacuum degree of the reaction cavity in the PECVD coating system 1 is controlled at 0.1 to 50 Pa.

The substrate may be fixedly or movably placed at a predetermined position in the reaction cavity.

According to an embodiment of the present disclosure, in the step of substrate activation, after the inert gas is introduced, the voltage of the bias power supply 60 may be controlled between 10V to 800V, with a pulse duty factor of 5% to 80% and an impulse frequency of 10 to 360 KHz, the power of the ICP generator 10 may be controlled between 50 W to 1000 W, and the activation time may be controlled between 1 to 30 minutes.

According to an embodiment of the present disclosure, the siloxane monomer may be an hydrocarbyl siloxane, a chain siloxane compound, or a cyclic siloxane compound.

For example, the siloxane monomer compound may have the following structure:

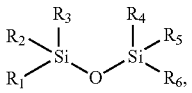

wherein, $R_1$ to $R_6$ are each independently one selected from a group consisting of $C_1$-$C_6$ alkyl group, $C_2$-$C_6$ alkenyl group, and hydrogen, where at least one of $R_1$ to $R_6$ does not represent hydrogen. Optionally, at least one of $R_1$ to $R_6$ has a hydrocarbyl group.

For example, the siloxane monomer compound may have the following structure:

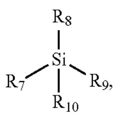

wherein, $R_7$ to $R_{10}$ are each independently one selected from a group consisting of $C_1$-$C_6$ alkyl group, $C_1$-$C_6$ alkoxy group, $C_2$-$C_6$ alkenyl group, and hydrogen, where at least one of $R_7$ to $R_{10}$ does not represent hydrogen, and at least one of $R_7$ to $R_{10}$ has oxygen to form a silicon-oxygen bond.

For example, the siloxane monomer compound may have the following structure:

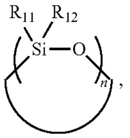

wherein, n represents 3 or 4, and $R_{11}$ and $R_{12}$ are each independently one selected from a group consisting of $C_1$-$C_6$ alkyl group, $C_2$-$C_6$ alkenyl group, and hydrogen, provided that at least one of $R_{11}$ and $R_{12}$ does not represent hydrogen.

According to some embodiments of the present disclosure, the siloxane monomer, that is, a raw material of the reactive gas for the organic hydrophobic coating, is one or more selected from a group consisting of hexamethyldisiloxane, tetramethyldisiloxane, hexaethyldisiloxane, 1,1,3,3-tetramethyldisiloxane, tetramethoxysilane, tetraethoxysilane, tetrapropoxysilane, allyltrimethoxysilane, trimethylcyclotrisiloxane, hexamethylcyclotri siloxane, octamethylcyclotetrasiloxane, tetramethyltetravinylcyclotetrasiloxane, dodecamethylcyclohexasiloxane, and decamethylcyclopentasiloxane.

According to an embodiment of the present disclosure, the step of ion bombardment includes:

evacuating to control the vacuum degree of the reaction cavity to not more than $1\times10^{-1}$ Pa;

introducing an inert gas, applying a bias voltage of 10 to 1000 V in the reaction cavity, and controlling the power of the ICP generator to 50 to 1000 W and the vacuum degree to 0.1 to 50 Pa, for ion bombardment activation; and introducing a reactive gas, applying a bias voltage of 10 to 1000 V in the reaction cavity, and controlling the power of the ICP generator to 100 to 1000 W and the vacuum degree to 0.1 to 50 Pa, for ion bombardment activation.

According to an embodiment of the present disclosure, the step of forming the transparent wear-resistant coating is implemented as follows.

Siloxane monomer steam is introduced. And then, a bias voltage of 100 to 1000V is applied in the reaction cavity, with a pulse duty factor of 5% to 80% and an impulse frequency of 10 to 360 KHz. Thereafter, the power of the ICP generator is controlled to 100 to 1000 W, and the vacuum degree is controlled to 0.5 to 80 Pa, for deposition and coating.

Example 1

Step 1. Substrate Cleaning

A glass sheet was respectively placed in deionized water and industrial ethanol for ultrasonic cleaning, for 10 minutes, so as to remove greasy dirt from the surface thereof.

Step 2. Substrate Activation

The cleaned and dried glass sheet was loaded into the reaction cavity of the PECVD coating system 1. And then, the reaction cavity was evacuated to below 1 $x10^{-2}$ Pa. Subsequently, argon gas was introduced at a flow rate of 100 sccm, and the vacuum degree was maintained at 2 Pa. Thereafter, a bias voltage of 300 V was applied on the carrier, and the ICP power was set to 600 W, to carry out ion bombardment, for 10 minutes, to increase the surface activity of the glass sheet.

Step 3. Formation of the Organic Hydrophobic Coating

Hexamethyldisiloxane steam was introduced at a monomer flow rate of 200 μL/min. At the same time, argon gas was introduced at a flow rate of 100 sccm. And then, a butterfly valve was adjusted to maintain a vacuum pressure of 6 Pa. Thereafter, a bias voltage of 600 V was applied on the carrier, and the ICP power was set to 800 W, to carry out coating, for 300 seconds, so as to prepare a super-hydrophobic coating.

Figure 4:
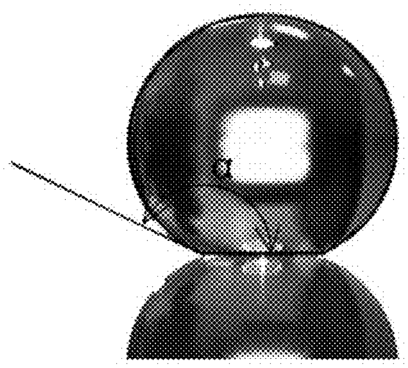
FIG. 4 is a schematic view of a water contact angle of a glass sheet with an organic hydrophobic coating formed by the PECVD coating system according to the first embodiment of the present disclosure.
Figure 5:
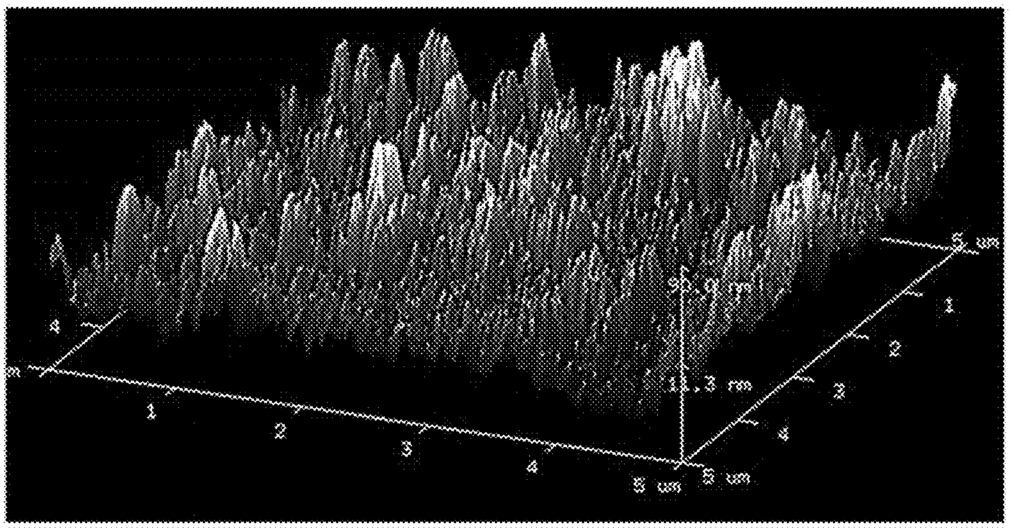
FIG. 5 is an AFM surface morphology picture of a glass sheet with an organic hydrophobic coating formed by the PECVD coating system according to the first embodiment of the present disclosure.
Figure 6:
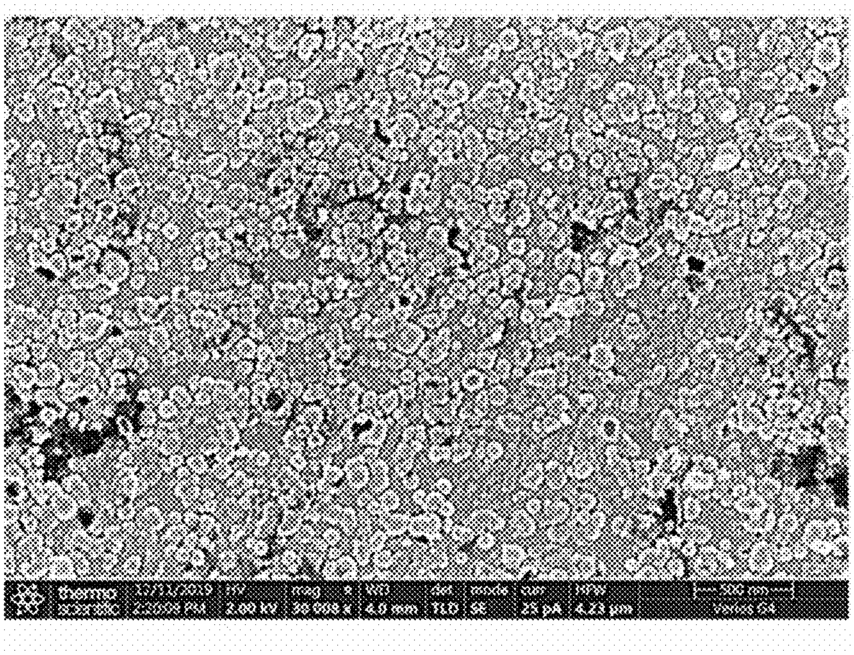
FIG. 6 is an SEM surface morphology picture of a glass sheet with an organic hydrophobic coating formed according to a PECVD coating system of the present disclosure.

The organic hydrophobic coating obtained in Example 1 has a thickness of 70 nm, and a measured water contact angle value of above 154°. The water contact angle picture is shown in FIG. 4, where the water droplet will roll away with slightly shaking. FIGS. 5 and 6 show the AFM and SEM morphology pictures of the organic hydrophobic coating, respectively.

The organic hydrophobic coating obtained in Example 1 has a sliding angle of less than 3°.

Figure 7:
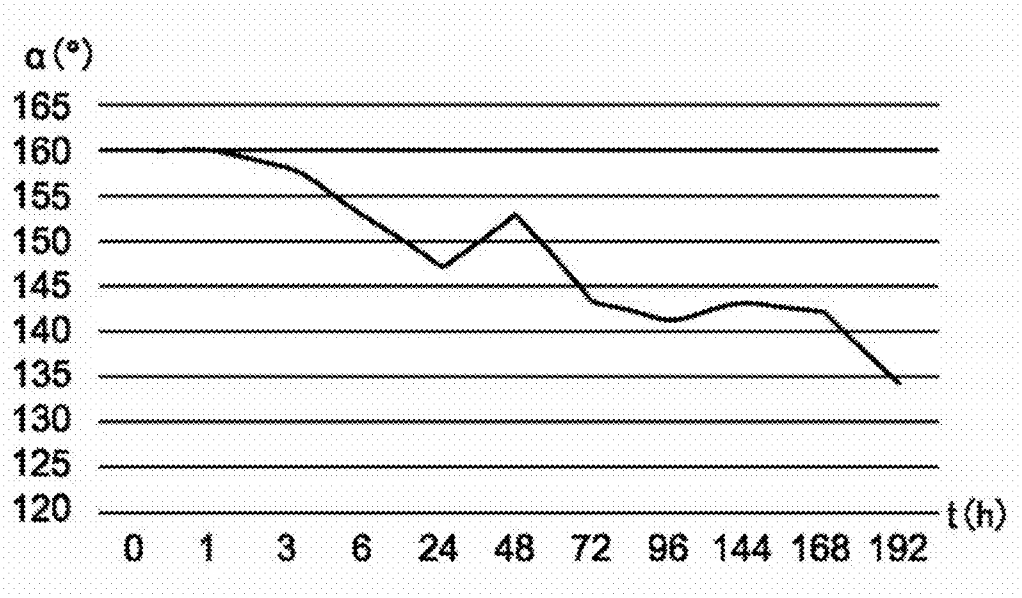
FIG. 7 is a schematic view of a variation curve of water drop contact angle in a salt spray test of a glass sheet with a super-hydrophobic coating formed according to the above preferred embodiment of the present disclosure.
Figure 8:
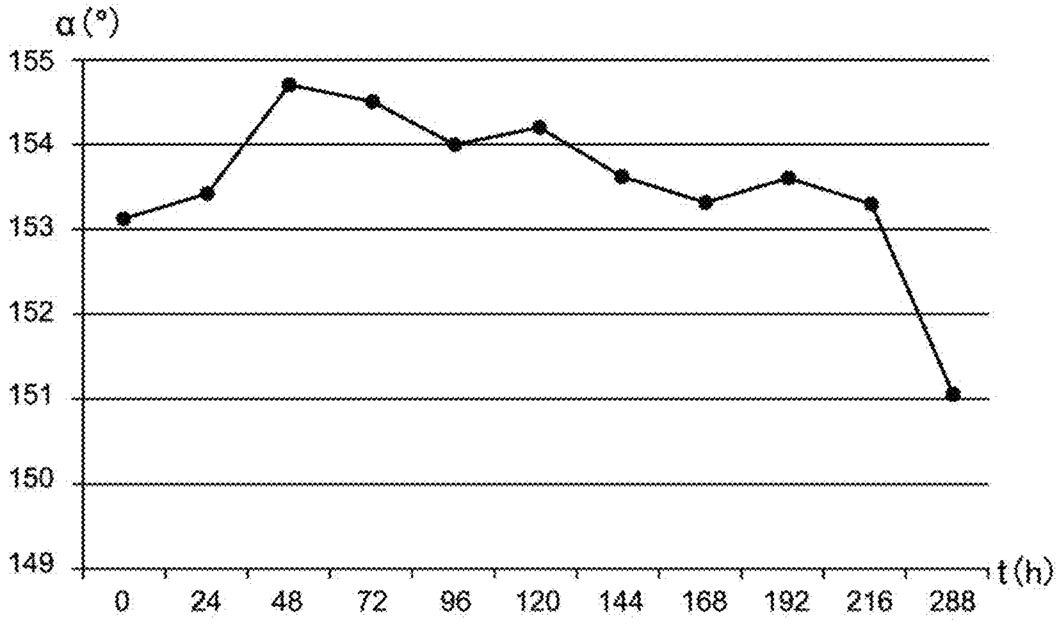
FIG. 8 is a schematic view of a variation curve of water drop contact angle in an ultraviolet aging test of a glass sheet with a super-hydrophobic coating formed according to the above preferred embodiment of the present disclosure.
Figure 9:
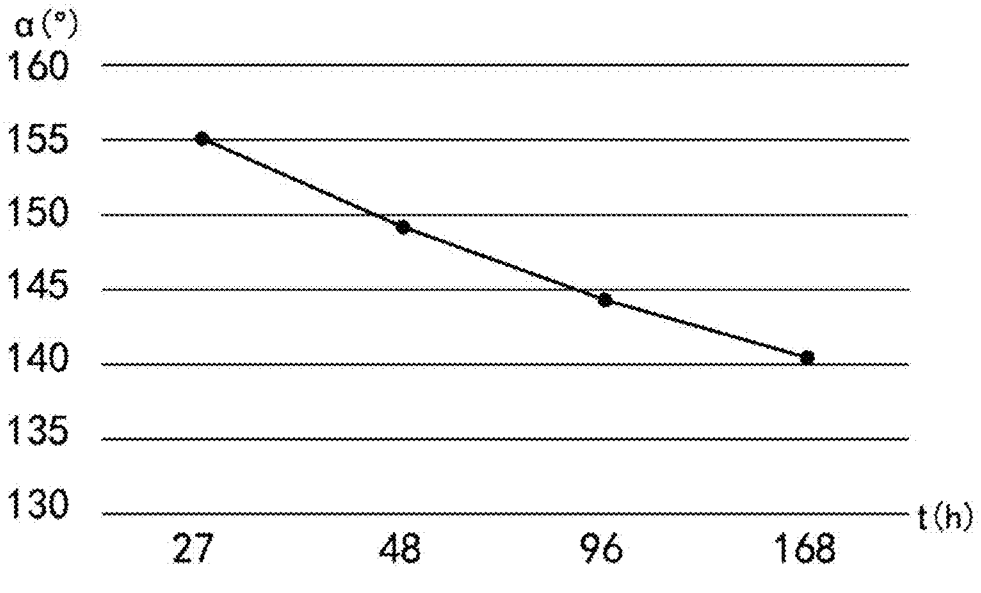
FIG. 9 is a schematic view of a variation curve of water drop contact angle in a high temperature and high humidity test of a glass sheet with a super-hydrophobic coating formed according to the above preferred embodiment of the present disclosure.

The transmittance value of the glass sheet with the organic hydrophobic coating formed thereon is reduced by less than 0.5%. At the same time, the ultraviolet aging resistance (0.35 $W/m^2$; temperature of around 50° C.; internal water tank; set temperature of around 50° C. for blackboard, actual temperature of around 47° C.), high temperature and high humidity resistance (85° C., 85% RH), and salt spray (5% NaCl solution, 35° C., 1 $Kg/cm^2$) properties were tested for the organic hydrophobic coating, as shown in FIGS. 7 to 9.

Example 2

Step 1. Substrate Cleaning

A PC sheet was respectively placed in deionized water and industrial ethanol for ultrasonic cleaning, for 10 minutes, so as to remove stains from the surface thereof.

Step 2. Substrate Activation

The cleaned PC sheet was dried by blowing with nitrogen gas, and then loaded into the reaction cavity of the PECVD coating system 1. Subsequently, the reaction cavity was evacuated to below 1 $x10^{-2}$ Pa, followed by introducing argon gas at a flow rate of 100 sccm and maintaining the vacuum degree at 2 Pa. Thereafter, a bias voltage of 300 V was applied on the carrier, and the ICP power was set to 600 W, to carry out ion bombardment, for 5 minutes, to increase the surface activity.

Step 3. Formation of the Organic Hydrophobic Coating

Tetramethyltetravinylcyclotetrasiloxane steam was introduced at a monomer flow rate of 200 μL/min. At the same time, argon gas was introduced at a flow rate of 100 sccm. And then, a butterfly valve was adjusted to maintain a vacuum pressure of 5 Pa. Thereafter, a bias voltage of 300 V was applied on the carrier, and the ICP power was set to 500 W, to carry out coating, for 500 seconds, so as to prepare a super-hydrophobic coating.

The organic hydrophobic coating prepared in Example 2 has a thickness of 125 nm, and a measured water contact angle value of above 158°.

Example 3

Step 1. Substrate Cleaning

A glass sheet was respectively placed in deionized water and industrial ethanol for ultrasonic cleaning, for 10 minutes, so as to remove stains from the surface thereof.

Step 2. Substrate Activation

The cleaned glass sheet was dried by blowing with nitrogen gas, and then loaded into the reaction cavity of the PECVD coating system 1. Subsequently, the reaction cavity was evacuated to below 1 $x10^{-2}$ Pa, followed by introducing argon gas at a flow rate of 100 sccm and maintaining the vacuum degree at 2 Pa. Thereafter, a bias voltage of 300 V was applied on the carrier, and the ICP power was set to 500 W, to carry out ion bombardment, for 5 minutes, to increase the surface activity.

Step 3. Formation of the Organic Hydrophobic Coating

Dodecamethylcyclohexasiloxane steam was introduced at a monomer flow rate of 300 μL/min. At the same time, argon gas was introduced at a flow rate of 100 sccm. And then, a butterfly valve was adjusted to maintain a vacuum pressure of 8 Pa. Thereafter, a bias voltage of 600 V was applied on the carrier, and the ICP power was set to 800 W, to carry out coating, for 500 seconds, so as to prepare a super-hydrophobic coating.

The organic hydrophobic coating prepared in Example 3 has a thickness of 155 nm, and a measured water contact angle value of above 156°.

Figure 10:
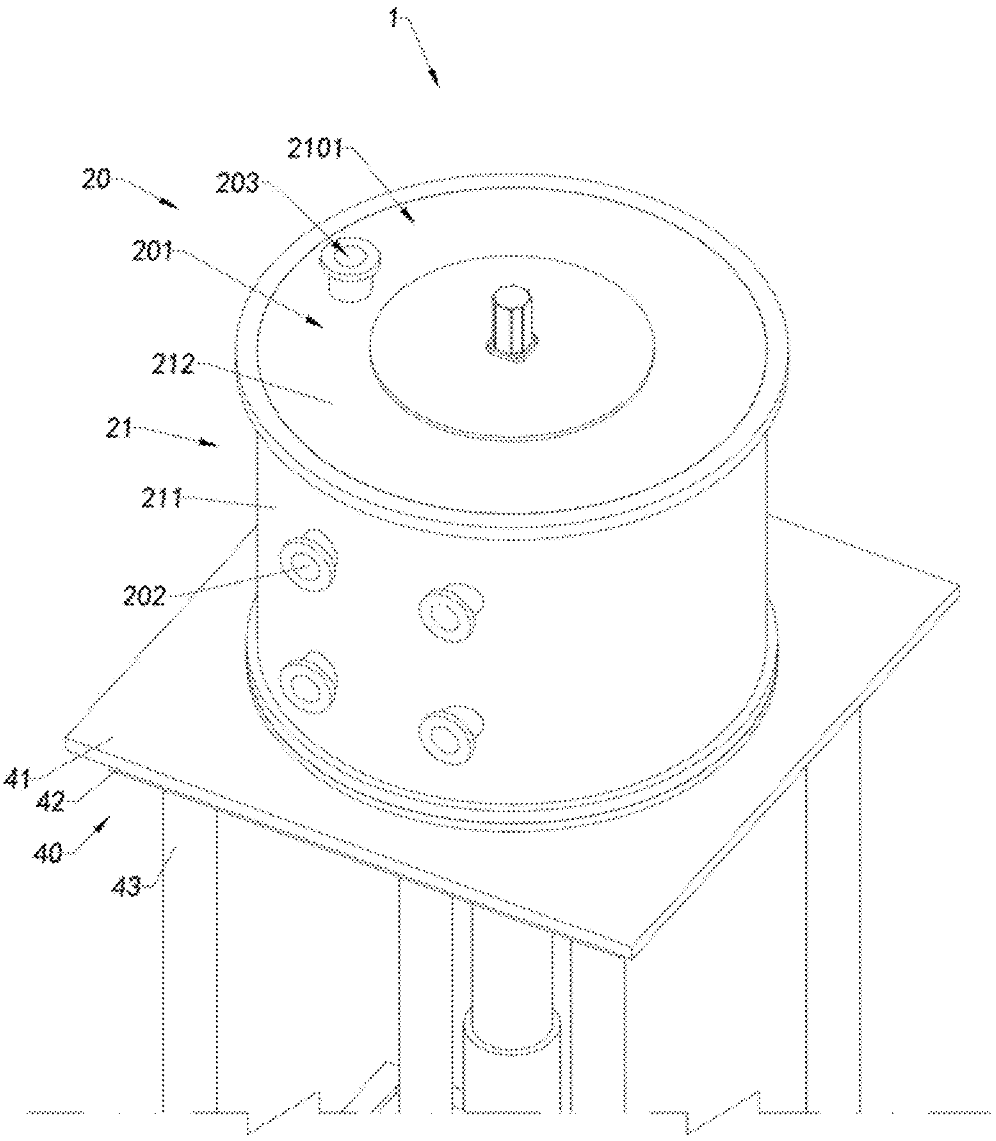
FIG. 10 is a schematic view of a PECVD coating system according to a second embodiment of the present disclosure.

FIG. 10 is a schematic view of a PECVD coating system according to a second embodiment of the present disclosure.

Figure 11:
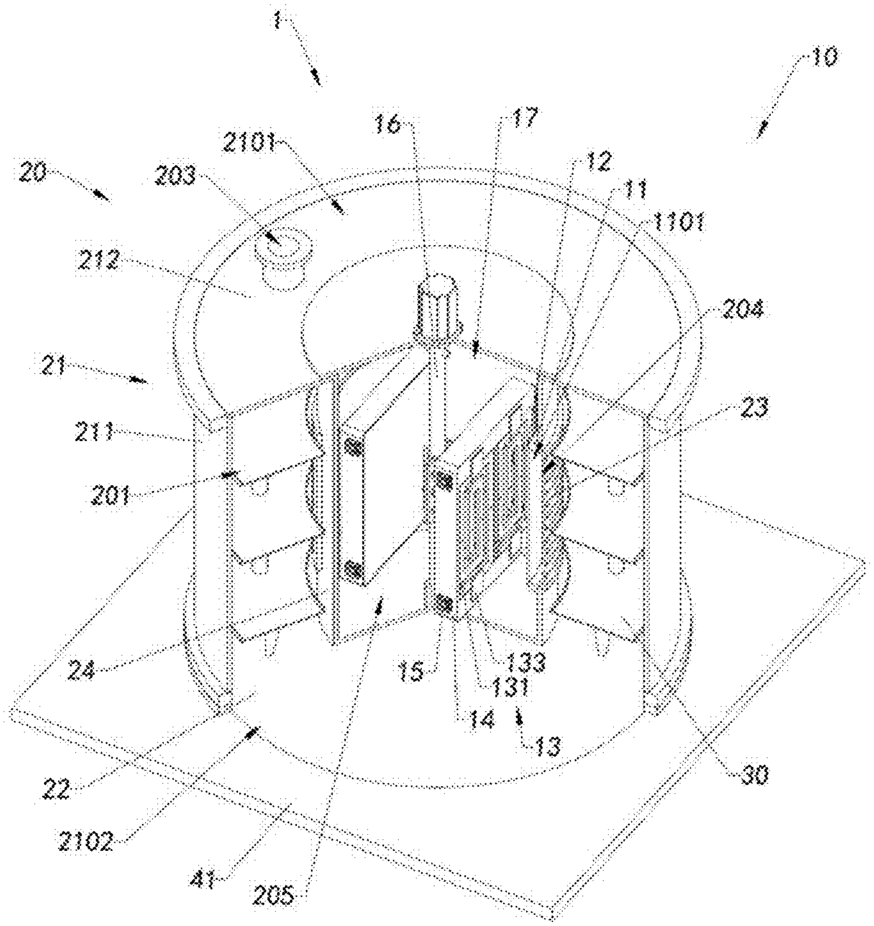
FIG. 11 is a schematic cutaway view of the PECVD coating system according to the second embodiment of the present disclosure.

FIG. 11 is a schematic partial cutaway view of the PECVD coating system according to the second embodiment of the present disclosure.

In this embodiment of the present disclosure, the ICP reaction device 1 includes a mounting shaft 16 and two discharge assemblies 13, which are symmetrically provided to the mounting shaft 16 in the back direction to form an ICP generator assembly 17. That is to say, an inductively coupled electric field is provided to the reaction cavity 201 by at least two discharge assemblies 13 symmetrically arranged in the back direction. In this embodiment of the present disclosure, the ICP generator is located on the inner side of the reaction chamber 20. During operation, the electric field generated by the ICP generator 10 passes through the discharge port 204 of the reaction chamber 20 from inside to outside, to enter the reaction cavity 201 of the reaction chamber 20.

The discharge assembly 13 includes an induction coil 131, a fixing plate 132, and a fixing element 133. And, the induction coil 131 and the fixing plate 132 are stacked and fixed to the fixing element 133.

The reaction chamber 20 has an ICP channel 205. According to some embodiments, the ICP channel 205 is provided at the central position of the reaction chamber 20. The ICP generator assembly 17 is provided within the ICP channel 205, to provide coupled electric and magnetic fields towards the reaction chamber from the ICP channel 205.

In this embodiment of the present disclosure, two discharge assemblies 13 share a set of the mounting frame 11 and the isolation plate 12, so that only one installation of the mounting frame 11 and the isolation plate 12 is required.

The reaction chamber 20 includes an inner wall 24, which forms the ICP channel 205. That is to say, in this embodiment of the present disclosure, the reaction cavity 201 is an annular closed channel. The discharge port 204 is provided on the inner wall 24. That is to say, the discharge port 204 communicates the ICP channel 205 with the reaction cavity 201.

The mounting frame 11 is provided to enclose the discharge port 204 on the inner wall 24. According to some embodiments, the mounting frame 11 has a section of an annular shape. The isolation plate 12 is provided to the window 1101 of the mounting frame 11, to hermetically isolate the ICP channel and the reaction cavity 201. Correspondingly, the isolation plate 12 is provided in an annular shape to the window 1101 of the mounting frame 11.

It is remarkable that, in this embodiment of the present disclosure, the ICP generator is provided and hidden inside the reaction chamber 20, and thus, there is no need to occupy external space, reducing the volume of space occupied by the entire PECVD coating system 1.

Figure 12:
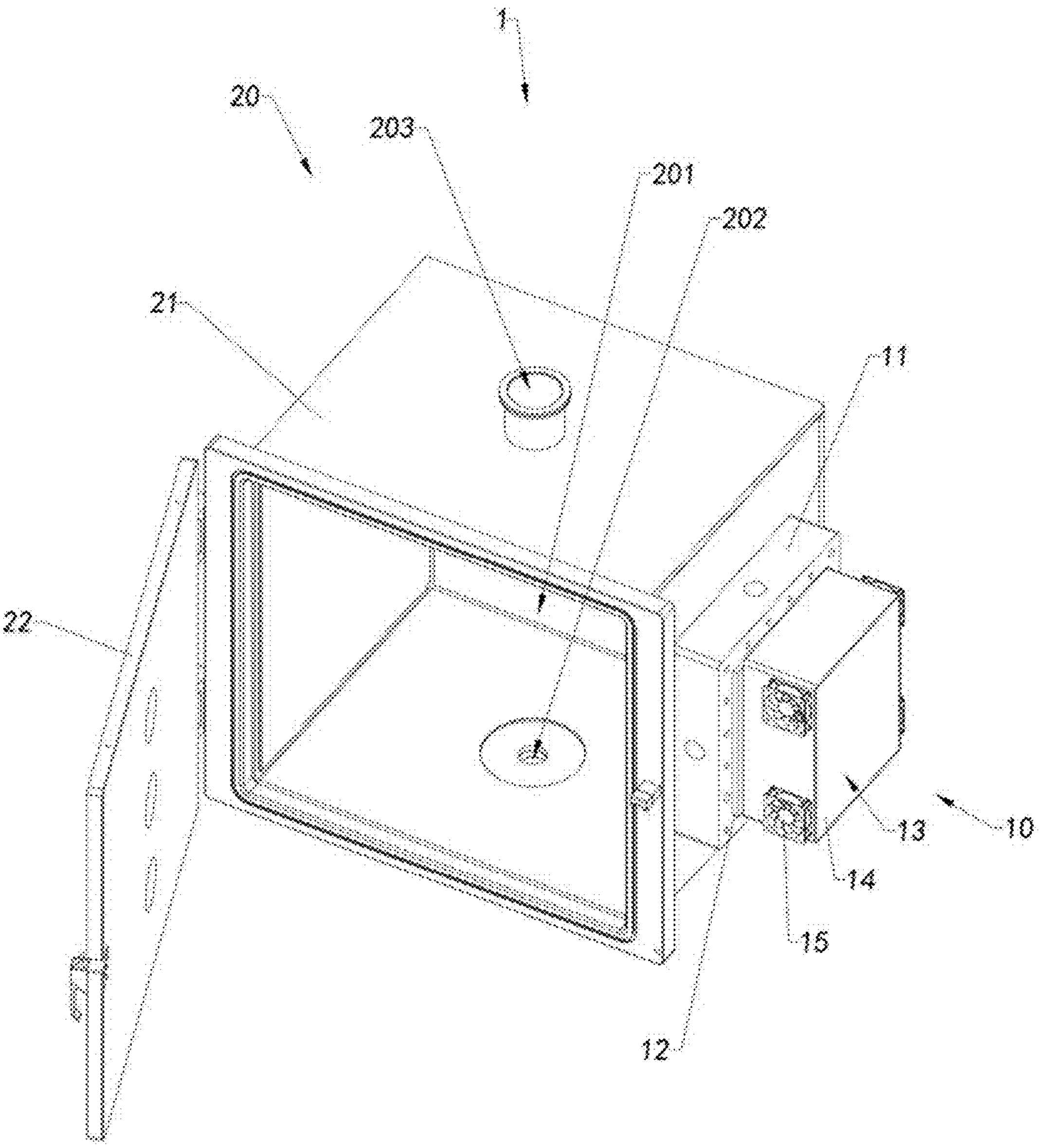
FIG. 12 is a schematic cutaway view of a PECVD coating system according to a third embodiment of the present disclosure.

FIG. 12 is a schematic view of the reaction chamber of the PECVD coating system according to a third embodiment of the present disclosure.

In this embodiment of the present disclosure, the reaction chamber 20 of the PECVD coating system is a square structure. The body 21 of the reaction chamber 20 is a box. The cover 22 is a control door. The box forms the reaction cavity 201. The box body has an opening which communicates the reaction cavity 201 with the external space. The control door is installed to the opening, when it is opened, the reaction cavity 201 is exposed, and when it is closed, the reaction cavity 201 is closed.

The control door may be a front plate of the reaction chamber 20. That is to say, the reaction chamber 20 may be opened from the front side. The control door may also be the top plate of the reaction chamber 20. That is to say, the reaction chamber 20 may also be opened from the top side. It should be understood by those skilled in the art that, the mode of opening the reaction chamber 20 here is only an example, and the opening mode of the reaction chamber 20 of the ICP reaction device 1 according to the present disclosure is not limited thereto.

In this embodiment of the present disclosure, the control door is located on the front side, that is, the opening of the box is located on the front side. The movable ICP generator 10 is provided on the box. Furthermore, the ICP generator 10 is optionally provided on at least one side of the box.

It should be understood by those skilled in the art that, the embodiments of the present disclosure shown in the above description and the accompanying drawings are only examples and do not limit the present disclosure. The objects of the present disclosure have been fully and effectively achieved. The functional and structural principles of the present disclosure have been shown and explained in the embodiments, and any variations or modifications of the embodiments of the present disclosure are possible without departing from the principles.

What is claimed is:

1. A coating method for forming an organic hydrophobic coating on a surface of a substrate by depositing through a plasma enhanced chemical vapor deposition (PECVD) coating equipment, comprising:

(A) providing an inductively coupled electric field to a reaction chamber of the PECVD coating equipment through an inductive coupling plasma (ICP) generator of the PECVD coating equipment, so as to form a coupled magnetic field; and (B) providing a bias electric field to the reaction chamber through a bias power supply of the PECVD coating equipment, wherein the ICP generator comprises a mounting frame, an isolation plate, a housing, and a discharge assembly for providing the inductively coupled electric field to the reaction cavity, the discharge assembly comprises a set of induction coils, the set of induction coils comprises at least two induction coils in planar spiral structures, electrically connected in series and arranged to reduce an electrostatic coupling effect between the coils and plasma, and wherein the mounting frame has a window, the isolation plate is installed on the window, with the surrounding side being sealed, the mounting frame is installed to the reaction chamber and provided to enclose a discharge port of the reaction chamber, the discharge assembly is provided on an outer side of the isolation plate, and the housing is provided on an outer side of the discharge assembly to cover the discharge assembly, and wherein in step (A), the ICP generator is located on the inner side of the reaction chamber, and during operation of the ICP generator, the inductively coupled electric field generated by the ICP generator passes through the discharge port of the reaction chamber from inside to outside, to enter a reaction cavity of the reaction chamber.

2. The coating method according to claim 1, wherein in step (A), a gas in the reaction chamber is extracted from an extraction opening of the reaction chamber, and the extraction opening and the ICP generator are located in two roughly perpendicular directions.

3. The coating method according to claim 1, wherein in step (A), a reactive gas is fed into the reaction chamber through an air inlet of the reaction chamber, and the air inlet is located in a direction where it is roughly parallel with the ICP generator.

4. The coating method according to claim 3, wherein a raw material of the reactive gas for the organic hydrophobic coating is one or more selected from a group consisting of hexamethyldisiloxane, tetramethyldisiloxane, hexaethyldisiloxane, 1,1,3,3-tetramethyldisiloxane, tetramethoxysilane, tetraethoxysilane, tetrapropoxysilane, allyltrimethoxysilane, trimethylcyclotrisiloxane, hexamethylcyclotrisiloxane, octamethylcyclotetrasiloxane, tetramethyltetravinylcyclotetrasiloxane, dodecamethylcyclohexasiloxane, and decamethylcyclopentasiloxane.

5. The coating method according to claim 1, wherein in step (A), the ICP generator is provided on the outer side of the reaction chamber, and during operation of the ICP generator, the inductively coupled electric field provided by the ICP generator passes through the discharge port of the reaction chamber from outside to inside, to enter a reaction cavity of the reaction chamber.

6. The coating method according to claim 5, wherein in step (A), the inductively coupled electric field is generated through the induction coils of the ICP generator.

7. The coating method according to claim 6, wherein in step (A), the induction coils and the reaction cavity are isolated at the discharge port by the isolation plate of the ICP generator.

8. The coating method according to claim 7, wherein in step (A), a matching work power supply is provided for the induction coils by means of a radio frequency power supply and a matcher.

9. The coating method according to claim 1, wherein in step (A), the inductively coupled electric field is provided to the reaction cavity by at least two discharge assemblies symmetrically arranged back to back with each other.

10. The coating method according to claim 1, wherein in step (A), the inductively coupled electric field is generated through the set of induction coils of the ICP generator, and the induction coils are symmetrically distributed.

11. The coating method according to claim 10, wherein in step (A), the induction coils and the reaction cavity are isolated at the discharge port by means of an annular isolation plate of the ICP generator.

12. The coating method according to claim 1, wherein in step (B), a positive electrode of the bias power supply is electrically connected to the reaction chamber, a negative electrode of the bias power supply is electrically connected to a carrier in the reaction chamber, and the reaction chamber is grounded.

13. The coating method according to claim 12, wherein in step (B), electrical connection to the bias power supply is maintained by means of an electrode connector of the carrier.

14. The coating method according to claim 1, wherein the ICP generator and the bias power supply are controlled to operate simultaneously.

15. The coating method according to claim 1 the organic hydrophobic coating contains Si and O, or Si, O and H.

16. The coating method according to claim 1, wherein the organic hydrophobic coating is formed from a chain siloxane compound or a cyclic siloxane compound.

17. The coating method according to claim 1, wherein the organic hydrophobic coating is a super-hydrophobic coating, and has a water contact angle of more than 150°.

18. A coating method for forming an organic hydrophobic coating on a surface of a substrate by depositing through a plasma enhanced chemical vapor deposition (PECVD) coating equipment, comprising:

(A) providing an inductively coupled electric field to a reaction chamber of the PECVD coating equipment through an inductive coupling plasma (ICP) generator of the PECVD coating equipment, so as to form a coupled magnetic field; and (B) providing a bias electric field to the reaction chamber through a bias power supply of the PECVD coating equipment, wherein the ICP generator comprises a mounting frame, an isolation plate, a housing, and a discharge assembly for providing the inductively coupled electric field to the reaction cavity, the discharge assembly comprises a set of induction coils, the set of induction coils comprises at least two induction coils in planar spiral structures, electrically connected in series and arranged to reduce an electrostatic coupling effect between the coils and plasma, and wherein the mounting frame has a window, the isolation plate is installed on the window, with the surrounding side being sealed, the mounting frame is installed to the reaction chamber and provided to enclose a discharge port of the reaction chamber, the discharge assembly is provided on an outer side of the isolation plate, and the housing is provided on an outer side of the discharge assembly to cover the discharge assembly, and wherein in step (B), a positive electrode of the bias power supply is electrically connected to the reaction chamber, a negative electrode of the bias power supply is electrically connected to a carrier in the reaction chamber, and the reaction chamber is grounded; electrical connection to the bias power supply is maintained by means of an electrode connector of the carrier; and a spring of a mounting fixed seat presses against a bottom plate of the carrier, to maintain contact between the electrode connector and the bias power supply.

19. A coating method for forming an organic hydrophobic coating on a surface of a substrate by depositing through a plasma enhanced chemical vapor deposition (PECVD) coating equipment, comprising:

(A) providing an inductively coupled electric field to a reaction chamber of the PECVD coating equipment through an inductive coupling plasma (ICP) generator of the PECVD coating equipment, so as to form a coupled magnetic field; and (B) providing a bias electric field to the reaction chamber through a bias power supply of the PECVD coating equipment, wherein the ICP generator comprises a mounting frame, an isolation plate, a housing, and a discharge assembly for providing the inductively coupled electric field to the reaction cavity, the discharge assembly comprises a set of induction coils, the set of induction coils comprises at least two induction coils in planar spiral structures, electrically connected in series and arranged to reduce an electrostatic coupling effect between the coils and plasma, and wherein the mounting frame has a window, the isolation plate is installed on the window, with the surrounding side being sealed, the mounting frame is installed to the reaction chamber and provided to enclose a discharge port of the reaction chamber, the discharge assembly is provided on an outer side of the isolation plate, and the housing is provided on an outer side of the discharge assembly to cover the discharge assembly, and wherein step (A) comprises opening or closing a cover of the reaction chamber by a lifting frame.

* * * * *